United States Patent
Minciunescu

(10) Patent No.: US 11,131,695 B2
(45) Date of Patent: Sep. 28, 2021

(54) MEASURING ELECTRICAL ENERGY CONSUMPTION

(71) Applicant: Analog Devices, Inc., Norwood, MA (US)

(72) Inventor: Petre Minciunescu, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 154 days.

(21) Appl. No.: 16/541,948

(22) Filed: Aug. 15, 2019

(65) Prior Publication Data

US 2021/0048461 A1    Feb. 18, 2021

(51) Int. Cl.
*G01R 22/06* (2006.01)
*G01R 19/00* (2006.01)
*G01R 27/16* (2006.01)
*G01R 15/04* (2006.01)

(52) U.S. Cl.
CPC ....... *G01R 22/066* (2013.01); *G01R 19/0069* (2013.01); *G01R 27/16* (2013.01); *G01R 15/04* (2013.01)

(58) Field of Classification Search
CPC ...... G01R 11/24; G01R 11/25; G01R 22/066; G01R 22/068
See application file for complete search history.

(56) References Cited

U.S. PATENT DOCUMENTS

| 6,522,033 B1 | 2/2003 | Nevo |
| 7,265,555 B2 | 9/2007 | Batten et al. |
| 2013/0093418 A1* | 4/2013 | Ramirez ............... G01R 22/066 324/244 |
| 2014/0167528 A1* | 6/2014 | Lancaster ............ H02H 11/008 307/130 |
| 2015/0002134 A1* | 1/2015 | Ramirez ................ G01R 11/24 324/110 |
| 2016/0169945 A1 | 6/2016 | Mauder et al. |
| 2016/0291060 A1 | 10/2016 | Wood et al. |

(Continued)

FOREIGN PATENT DOCUMENTS

CN    112394221 A    2/2021

OTHER PUBLICATIONS

"European Application Serial No. 20187853.5, Extended European Search Report dated Jan. 20, 2021", 9 pgs.

*Primary Examiner* — Tung X Nguyen
(74) *Attorney, Agent, or Firm* — Schwegman Lundberg & Woessner, P.A.

(57) ABSTRACT

The present disclosure is concerned with measuring the amount of electrical energy consumed even when the electric meter has been tampered with. Electric meters may be fraudulently tampered with by connecting a bypass element, such as a conductive wire or cable, across the terminals of the meter in order to bypass the electric meter. This means that only part of the consumed electrical current passes through the electric meter for measurement, resulting in some of the consumed electrical energy not being measured and therefore not being billed for. However, in the present invention a technique has been developed to enable the electric meter to determine the amount of electrical current that bypasses the meter and therefore measure the amount electrical energy consumed even when the electric meter has been tampered with.

20 Claims, 9 Drawing Sheets

(56) References Cited

U.S. PATENT DOCUMENTS

2017/0254842 A1 9/2017 Bahl et al.
2019/0079117 A1 3/2019 Hurwitz et al.
2019/0120885 A1 4/2019 Kraus et al.

* cited by examiner

MEASURING ELECTRICAL ENERGY CONSUMPTION

TECHNICAL FIELD

The present disclosure relates to the measurement of electrical energy consumed by a consumer load.

BACKGROUND

Electric meters (sometimes also referred to as electricity meters or utility meters) are designed to measure the amount of electrical energy consumed by a consumer load so that the consumer can be billed accurately. Electric meters comprise a current sensor, such as a current shunt or a current transformer or a Rogowski coil, in series with the consumer load in order to measure the amount of current flowing through the consumer load. Electric meters also measure the voltage across the consumer load so that the amount of energy consumed by the consumer load can be measured.

Sometimes electric meters are tampered with to cause the meter to measure less energy than is actually consumed by the consumer load, thereby fraudulently the electricity bill. Such tampering represents theft of electrical energy. There is a desire for electric meters to be able to continue measuring the amount of energy actually consumed, even when the electric meter has been tampered with.

SUMMARY

The present disclosure is concerned with measuring the amount of electrical energy consumed even when the electric meter has been tampered with. Electric meters may be fraudulently tampered with by connecting a bypass element, such as a conductive wire or cable, across the terminals of the meter in order to bypass the electric meter. This means that only part of the consumed electrical current passes through the electric meter for measurement, resulting in some of the consumed electrical energy not being measured and therefore not being billed for. However, in the present invention a technique has been developed to enable the electric meter to determine the amount of electrical current that bypasses the meter and therefore measure the amount electrical energy consumed even when the electric meter has been tampered with.

In a first aspect of the present disclosure, there is provided an energy measurement unit for use with an electric meter to measure energy consumed by a consumer load, wherein the electric meter comprises a measurement path coupled between a phase line input terminal and a phase line output terminal of the electronic meter, and wherein the measurement path comprises a current sensor for use in measuring electrical energy consumption, the energy measurement unit being configured to: measure, using the current sensor, a meter current flowing through the measurement path; measure a voltage between the phase line input terminal and the phase line output terminal; determine a bypass impedance between the phase line input terminal and the phase line output terminal, in parallel with the measurement path; determine a bypass current flowing between the phase line output terminal and the phase line output terminal, in parallel with the measurement path, based at least in part on the determined bypass impedance; and determine the energy consumed by the consumer load based at least in part on the meter current and the bypass current.

The energy measurement unit may be further configured to: measure an apparent impedance of the current sensor; and determine the bypass impedance based at least in part on the apparent impedance of the current sensor and a known impedance of the current sensor.

The measurement path may further comprise a switch in series with the current sensor, and the energy measurement unit may be further configured to: determine an impedance of the switch; wherein determining the bypass impedance is further based at least in part on the impedance of the switch.

Determining the impedance of the switch may be further based on the meter current, the known impedance of the current sensor, and the voltage between the phase line input terminal and the phase line output terminal.

The electric meter may further comprise a voltage divider coupled to the measurement path and configured to produce a voltage measurement signal that is dependent on, but is smaller than, the voltage between the phase line input terminal and the phase line output terminal, and wherein the energy measurement unit may be further configured to: determine the voltage between the phase line input terminal and the phase line output terminal based at least in part on the voltage measurement signal.

The voltage divider may comprise: a first input coupled to the phase line input terminal; and a second input coupled to the phase line output terminal, such that the voltage divider is coupled across the phase line input terminal and the phase line output terminal, in parallel with the measurement path.

The voltage divider may comprise: a first input coupled to the phase line output terminal; and a second input is coupled to a neutral terminal of the electric meter, such that the voltage measurement signal is indicative of a potential of the phase line output terminal relative to neutral, wherein the energy measurement unit is configured to determine the voltage between the phase line input terminal and the phase line output terminal by: determining the potential of the phase line output terminal relative to neutral based on the voltage measurement signal; determining a potential of the phase line input terminal relative to neutral; and determining the voltage between the phase line input terminal and the phase line output terminal based on the potential of the phase line input terminal relative to neutral and the potential of the phase line output terminal relative to neutral.

The voltage divider may comprise: a potential divider coupled between the first input and the second input, wherein the potential divider comprises two impedance elements, one of which has a larger impedance than the other, and wherein the voltage measurement signal is indicative of a voltage across the smaller impedance element of the potential divider.

The energy measurement unit may be further configured to measure the apparent impedance of the current sensor by: applying an injection signal of known current and frequency across the current sensor; and measuring a resulting voltage substantially at the known frequency.

The method may further comprise: measuring an apparent impedance of the current sensor; and determining the impedance of the bypass element based at least in part on the apparent impedance of the current sensor and a known impedance of the current sensor.

The measurement path may further comprise a switch in series with the current sensor, and the method may further comprise: determining an impedance of the switch; wherein determining the impedance of the bypass element is further based at least in part on the impedance of the switch.

Determining the impedance of the switch may be further based on the meter current, the known impedance of the current sensor, and the voltage between the phase line input terminal and the phase line output terminal.

The electric meter may further comprise a voltage divider coupled to the measurement path and configured to produce a voltage measurement signal that is dependent on, but is smaller than, the voltage between the phase line input terminal and the phase line output terminal, and wherein the method may further comprise: determining the voltage between the phase line input terminal and the phase line output terminal based at least in part on the voltage measurement signal.

Measuring the apparent impedance of the current sensor may comprise: applying an injection signal of known current and frequency across the current sensor; and measuring a resulting voltage substantially at the known frequency.

In a third aspect of the present disclosure there is provided a computer program that, when executed by one or more processors, cause the one or more processors to carry out the method of the second aspect.

In a fourth aspect of the present disclosure, there is provided a method of determining an impedance of a bypass element coupled to an electric meter, wherein the electric meter comprises a measurement path comprising a current sensor for use in measuring electrical energy consumption, and wherein the bypass element is coupled across a phase line input terminal and a corresponding phase line output terminal of the electric meter, in parallel with the measurement path, so as to at least partially bypass the current sensor, the method comprising: measuring an apparent impedance of the current sensor; and determining an impedance of the bypass element based at least in part on the apparent impedance of the current sensor and a known impedance of the current sensor.

The measurement path may further comprise a switch in series with the current sensor, and the method may further comprise: determining an impedance of the switch; wherein determining the impedance of the bypass element is further based at least in part on the impedance of the switch.

The method may further comprise: measuring a voltage between the phase line input terminal and the phase line output terminal, wherein determining the impedance of the switch is further based on the meter current, the known impedance of the current sensor, and the voltage between the phase line input terminal and the phase line output terminal.

The method may further comprise: measuring a voltage between the phase line input terminal and the phase line output terminal; and determining a bypass current flowing through the bypass element based on the determined impedance of the bypass element and the voltage between the phase line input terminal and the phase line output terminal.

The method may further comprise: measuring, using the current sensor, a meter current flowing through the measurement path; and determining the actual energy consumed based at least in part on the meter current and the bypass current.

In a fifth aspect of the present disclosure there is provided a computer program that, when executed by one or more processors, cause the one or more processors to carry out the method of the fourth aspect.

In a sixth aspect of the present disclosure, there is provided an electric meter, comprising: a phase line input terminal and a corresponding phase line output terminal; a measurement path coupling the phase line input terminal to the phase line output terminal, the measurement path comprising a current sensor for use in measuring electrical energy consumption; and an energy measurement unit coupled to the measurement path to determine actual energy consumed when a bypass element is coupled across the phase line input terminal and the phase line output terminal so as to at least partially bypass the current sensor, wherein the energy measurement unit is configured to: measure, using the current sensor, a meter current flowing through the measurement path; measure a voltage between the phase line input terminal and the phase line output terminal; determine an impedance of the bypass element; determine a bypass current flowing through the bypass element, based at least in part on the impedance of the bypass element and the voltage between the phase line input terminal and the phase line output terminal; and determine the actual energy consumed based at least in part on the meter current and the bypass current.

The electric meter may be a single-phase electric meter, or a multi-phase electric meter, such as a two-phase, or three-phase, or four-phase electric meter.

The electric meter may further comprise: a voltage divider coupled to the measurement path and configured to produce a voltage measurement signal that is dependent on, but is smaller than, the voltage between the phase line input terminal and the phase line output terminal, wherein the energy measurement unit is further configured to determine the voltage between the phase line input terminal and the phase line output terminal based at least in part on the voltage measurement signal.

The voltage divider may comprise: a first input coupled to the phase line input terminal; and a second input coupled to the phase line output terminal, such that the voltage divider is coupled across the phase line input terminal and the phase line output terminal, in parallel with the measurement path.

The voltage divider may comprise: a first input coupled to the phase line output terminal; and a second input is coupled to a neutral terminal of the electric meter, such that the voltage measurement signal is indicative of a potential of the phase line output terminal relative to neutral, wherein the energy measurement unit is configured to determine the voltage between the phase line input terminal and the phase line output terminal by: determining the potential of the phase line output terminal relative to neutral based on the voltage measurement signal; determining a potential of the phase line input terminal relative to neutral; and determining the voltage between the phase line input terminal and the phase line output terminal based on the potential of the phase line input terminal relative to neutral and the potential of the phase line output terminal relative to neutral.

The voltage divider may comprise: a potential divider coupled between the first input and the second input, wherein the potential divider comprises two impedance elements, one of which has a larger impedance than the other, and wherein the voltage measurement signal is indicative of a voltage across the smaller impedance element of the potential divider.

There is also disclosed an energy measurement unit for use with an electric meter to determine actual energy consumed when a bypass element is coupled to the electric meter, wherein the electric meter comprises a measurement path comprising a current sensor for use in measuring electrical energy consumption, and wherein the bypass element is coupled across a phase line input terminal and a corresponding phase line output terminal of the electric meter, in parallel with the measurement path, so as to at least partially bypass the current sensor, the energy measurement unit being configured to: measure, using the current sensor, a meter current flowing through the measurement path; measure a voltage between the phase line input terminal and the phase line output terminal; determine an impedance of the bypass element; determine a bypass current flowing through the bypass element, based at least in part on the impedance of the bypass element and the voltage between the phase line input terminal and the phase line output terminal; and determine the actual energy consumed based at least in part on the meter current and the bypass current.

In a second aspect of the present disclosure, there is provided a method of determining actual energy consumed when a bypass element is coupled to an electric meter, wherein the electric meter comprises a measurement path comprising a current sensor for use in measuring electrical energy consumption, and wherein the bypass element is coupled across a phase line input terminal and a corresponding phase line output terminal of the electric meter, in parallel with the measurement path, so as to at least partially bypass the current sensor, the method comprising: measuring, using the current sensor, a meter current flowing through the measurement path; measuring a voltage between the phase line input terminal and the phase line output terminal; determining an impedance of the bypass element; determining a bypass current flowing through the bypass element, based at least in part on the impedance of the bypass element and the voltage between the phase line input terminal and the phase line output terminal; and determining the actual energy consumed based at least in part on the meter current and the bypass current.

DRAWINGS

Aspects of the present disclosure are described, by way of example only, with reference to the following drawings, in which.

DETAILED DESCRIPTION

Electric meters may be tampered with by connecting a bypass element, such as a conductive wire or cable, across the phase line terminals of the meter in order to bypass the electric meter. By tampering with the meter in this way, at least some (if not all) of the current consumed by the consumer load bypasses the electric meter and cannot be measured by the current sensor in the electric meter. This results in the theft of electrical energy.

In the present disclosure, the impedance of the bypass element is determined by measuring the impedance of the current sensor of the electric meter to determine the apparent impedance of the current sensor. When there is no bypass element connected across the phase line terminals, the apparent impedance of the current sensor is substantially the same as the actual impedance of the current sensor. In this case, the determined bypass impedance across the phase line terminals will be determined to be very high, such that the bypass current will be determined to be very low, tending to zero. However, when the bypass element is connected, the relatively low impedance of the bypass element in parallel with the current sensor changes the apparent impedance of the current sensor. The impedance of the bypass element can therefore be determined from the measured apparent impedance and the known, actual impedance of the current sensor.

When the impedance of the bypass element is known, the bypass current flowing through the bypass element can be determined by measuring the voltage across the phase line terminals of the electric meter. The total current actually consumed by the consumer load is the sum of the current flowing through the bypass element and the current flowing through the electric meter. Therefore, the total current consumed, and therefore the total electrical energy consumed, can be determined by the electric meter even when the electric meter has been tampered with using a bypass element.

Figure 1:
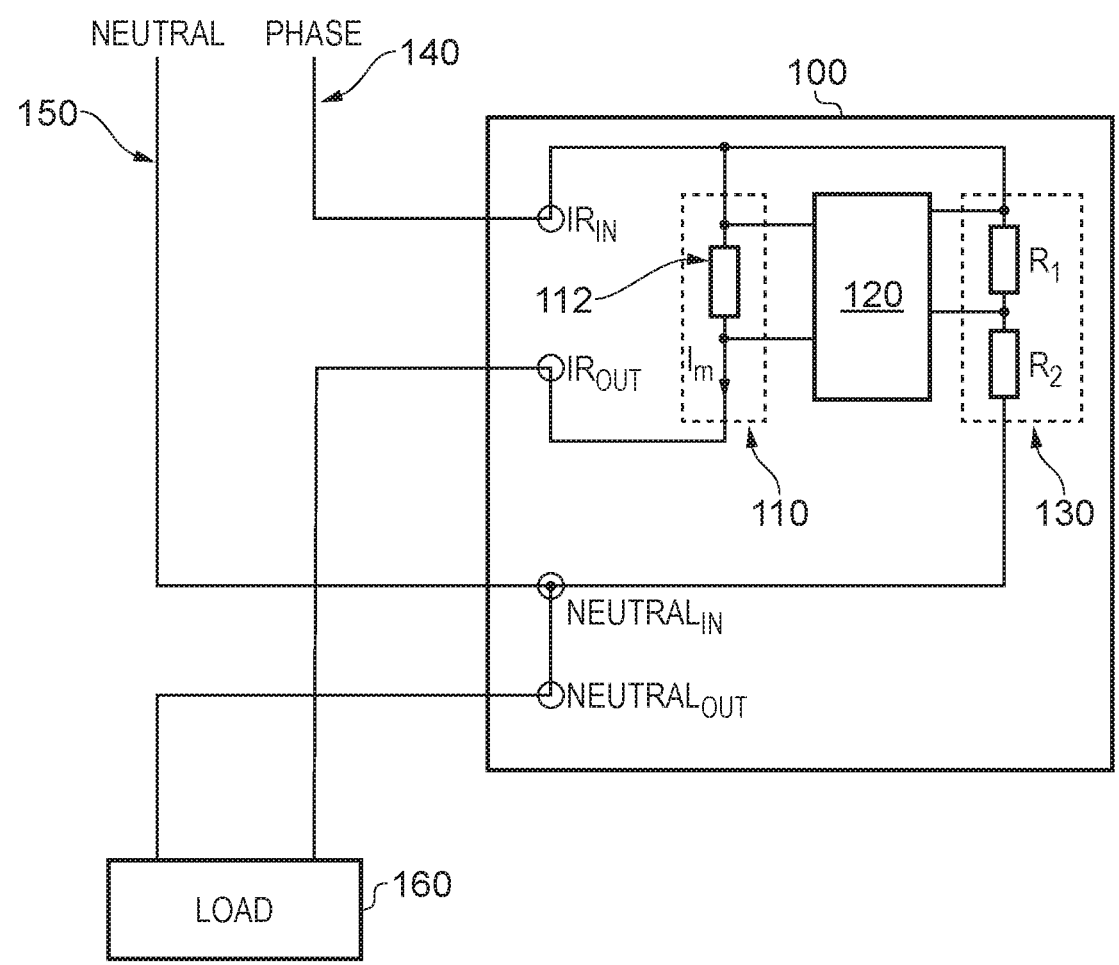
FIG. 1 shows a schematic representation of an example electric meter in accordance with an aspect of this disclosure.

FIG. 1 shows a schematic representation of an example single phase electric meter 100 in accordance with an aspect of the present disclosure. The electric meter 100 is coupled to a phase power line 140, which feeds current from an electric power transmission network (such as the 'power grid' or the 'national grid'), and a neutral power line 150, which returns current to the electric power transmission network. The electric meter 100 is also coupled to a consumer load 160 and the electric meter 100 is configured to measure the amount of electrical energy consumed by the load 160.

The electric meter 100 includes a measurement path 110 that comprises a current sensor 112. In this example, the current sensor 112 is a shunt resistor having an impedance $R_{SENSOR}$, but it may alternatively be any other suitable type of current sensor, such as a current transformer (CT) or Rogowski coil. The electric meter 100 further includes a phase line input terminal $IR_{in}$, which is coupled to the phase power line 140, and a phase line output terminal $IR_{out}$, which is coupled to the consumer load 160. The measurement path 110 is coupled across the phase line input terminal $IR_{in}$ and the phase line output terminal $IR_{out}$ such that current flows from the phase power line 140 to the consumer load 160 via the phase line input terminal $IR_{in}$, measurement path 110 and phase line output terminal $IR_{out}$.

The electric meter 100 further includes an energy measurement unit 120 that is coupled to the current sensor 112 in order to measure a meter current $I_m$ flowing through the measurement path 110. For example, the energy measurement unit 120 may store an accurate record of the impedance $R_{SENSOR}$ of the current sensor 112 and measure the voltage across the current sensor 112, for example using an analog to digital converter (ADC). The meter current $I_m$ can then be found according to the formula I=V/R. In normal operation, the meter current $I_m$ is the same as the current flowing through the load 160, so the measurement of meter current $I_m$ can be used to measure the energy consumed by the consumer load 160. As the skilled person will appreciate, $R_{SENSOR}$ is typically very small (for example, in the order of micro-ohms, such as 50 µΩ, or 100 µΩ, or 200 µΩ, etc), so the voltage across the current sensor 112, and therefore the amount of energy consumed by the current sensor 112 itself, is also very small.

The electric meter 100 further includes a voltage sensor 130 comprising a resistor divider for use in measuring the neutral to phase voltage, i.e., the voltage between a neutral terminal $NEUTRAL_{IN}$ or $NEUTRAL_{OUT}$ of the electric meter 100 and the phase line input terminal $IR_{IN}$ (or alternatively phase line output terminal $IR_{OUT}$). In a domestic environment, the phase to line voltage is typically between about 115 and 250 volts RMS, and hence may experience peak voltages in excess of 300V. In view of this, the voltage sensor 130 comprises resistor $R_1$ and resistor $R_2$. Resistor $R_1$ is typically relatively small (for example, in the order of kΩs, such as 1 kΩ, or 2 kΩ, etc) and resistor $R_2$ is typically relatively large (for example, in the order of MΩs, such as 1MΩ, or 2MΩ, etc). This means that the voltage across $R_1$ transforms the neutral to phase voltage domain to a smaller voltage domain more suitable for measurement by, for example, an analog to digital converter (ADC) within the energy measurement unit 120. Furthermore, because $R_2$ is relatively large, the amount of current flowing through the voltage sensor 130 is negligible. Since the neutral to phase voltage is also the voltage across the consumer load 160, the energy measurement unit 120 is able to measure the voltage across the consumer load 160 and the current ($I_m$) flowing through the consumer load 160 and therefore determine the amount of electrical energy consumed by the consumer load 160.

Figure 2:
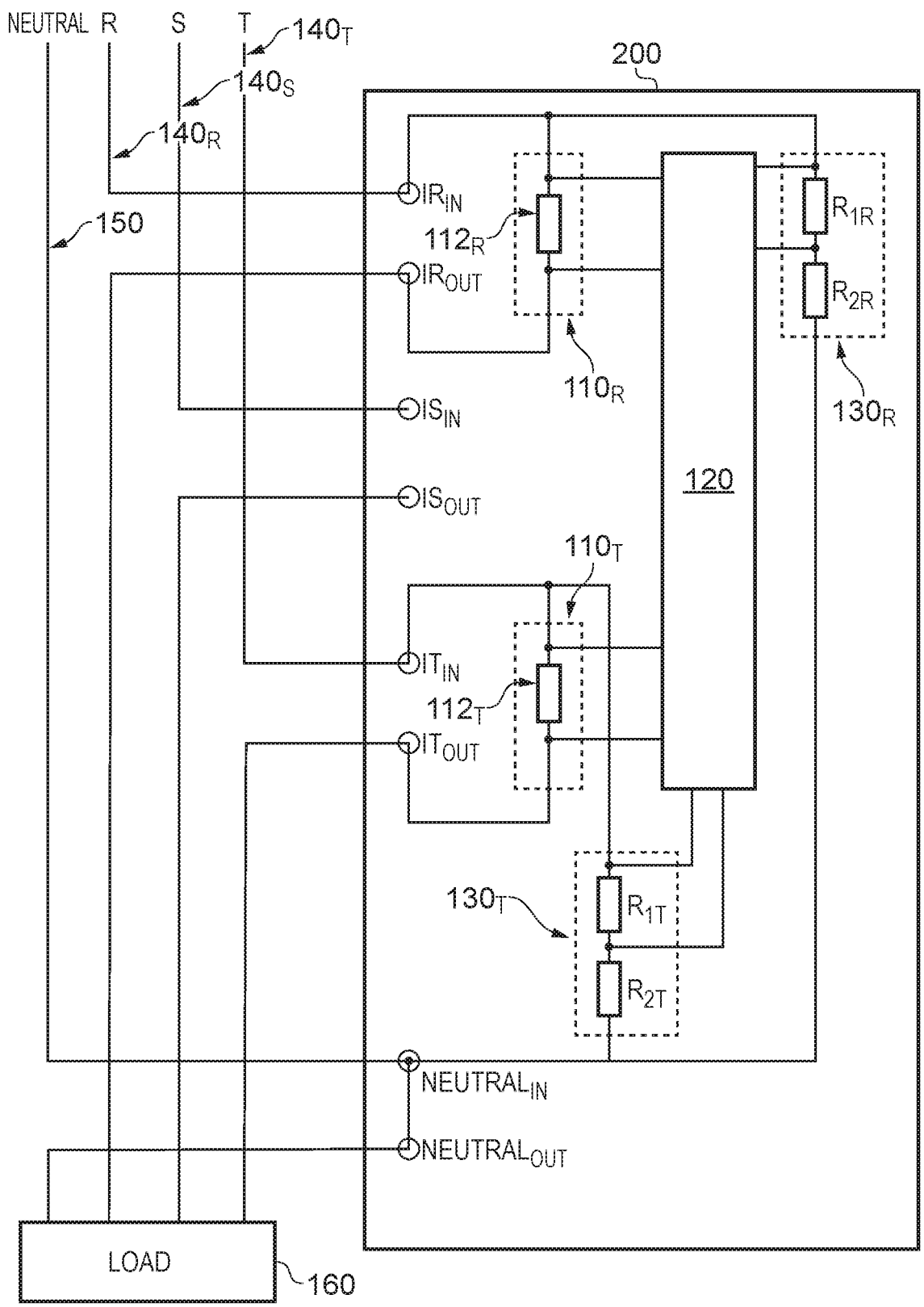
FIG. 2 shows a schematic representation of an example electric meter in accordance with a further aspect of this disclosure.

FIG. 2 shows a schematic representation of an example three phase electric meter 200 in accordance with an aspect of the present disclosure. The three phases are labelled as 'R', 'S' and 'T'. As can be seen, the electric meter 200 has a phase line input terminal $IR_{IN}$ and a corresponding phase line output terminal $IR_{OUT}$ for phase R, a phase line input terminal $IS_{IN}$ and a corresponding phase line output terminal $IS_{OUT}$ for phase S and a phase line input terminal $IT_{IN}$ and a corresponding phase line output terminal $IT_{OUT}$ for phase T. Each phase has a corresponding measurement path, current sensor and voltage measuring resistor divider (this is not represented in FIG. 2 for phase S for the sake of simplicity). Therefore, the energy measurement unit 120 is able to measure the meter current and phase to neutral voltage for each phase and therefore determine the overall energy consumed by the consumer load 160.

For the sake of simplicity, the rest of this disclosure focuses only on the single phase electric meter 100. However, it will be appreciated that the principles disclosed herein may equally be applied to multi-phase electric meters, such as two-phase, three-phase, four-phase, etc, electric meters.

Figure 3:
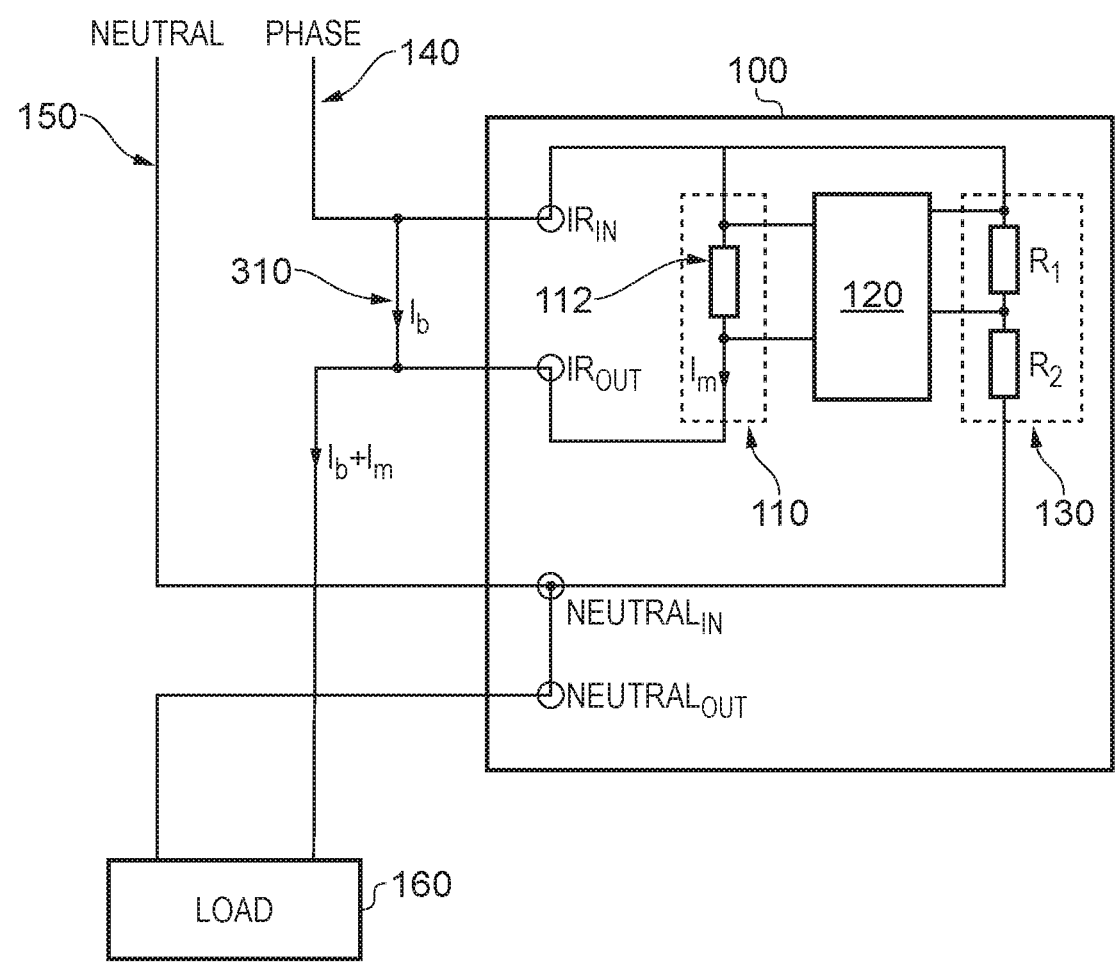
FIG. 3 shows a schematic representation of a meter tampering event where a bypass element is connected across the phase terminals of the electric meter of FIG. 1.

FIG. 3 shows a representation of a meter tampering event where a bypass element 310 (such as a conductive wire or cable) has been coupled across the phase line input terminal $IR_{IN}$ and the phase line output terminal $IR_{OUT}$, in parallel with the measurement path 110, so as to at least partially bypass the current sensor 112. Therefore, the bypass element 310 effectively shorts, or bypasses, the electric meter 100. The bypass element 310 may either be coupled directly to the phase line input terminal $IR_{IN}$ and the phase line output terminal $IR_{OUT}$, or may be coupled to the phase line input terminal $IR_{IN}$ and the phase line output terminal $IR_{OUT}$ via the cables that run between the phase power line 140 and the electric meter 100 (for example, if a short amount of cable coupled to the phase line input terminal $IR_{IN}$ is exposed outside of the electric meter 100 and a short amount of cable coupled to the phase line output terminal $IR_{OUT}$ is exposed outside of the electric meter 100, the bypass element 310 may be connected between those two sections of exposed cable, thereby shorting the phase line input terminal $IR_{IN}$ and the phase line output terminal $IR_{OUT}$).

By tampering with the electric meter 100 in this way, a bypass current $I_b$ will flow through the bypass element 310. The total amount of current flowing to the consumer load 160 will equal $I_m+I_b$, but the utility meter 100 will only detect the meter current $I_m$. This means that the amount of energy actually consumed by the consumer load 160 will be greater than the amount measured by the energy measurement unit 120, meaning that electrical energy will be stolen. The larger $I_b$ is, the more energy will be stolen. Therefore, if the impedance $R_{BYPASS}$ of the bypass element 310 is a lot smaller than the impedance $R_{SENSOR}$ of the current sensor 112, then a significant amount of energy may be stolen. In particular, if $R_{BYPASS}$ tends to 0ΩQ, the current sensor 112 will be completely bypassed such that the energy measurement unit 120 will determine that no energy is being consumed by the consumer load 160. If the impedance $R_{BYPASS}$ of the bypass element 310 is the same as, or slightly larger than, the impedance $R_{SENSOR}$ of the current sensor 112, for example, two, three or four times larger, the current sensor 112 will be only partially bypassed, but some energy will nevertheless be stolen.

Some electric meters 100 are equipped with a further current sensor, most typically a CT, between the $NEUTRAL_{IN}$ and $NEUTRAL_{OUT}$ terminals. In these implementations, the energy measurement unit 120 may be configured to monitor the current measured by both the current sensor 112 and the further current sensor. During normal operation, the current measured by current sensor 112 will be substantially equal to the current measured by the further current sensor. However, if the bypass element 310 is connected, the current measured by the current sensor 112 will not be substantially equal to the current measured by the further current sensor. Therefore, by comparing the current measured by the current sensor 112 and the further current sensor, the energy measurement unit 120 can detect if the bypass element 310 has been connected. However, whilst it may make this detection and potentially trigger an alert to the electricity supply company to visit the electric meter 100 and investigate, the size of the bypass current $I_b$ is not detected, so the amount of energy actually consumed during the bypass event is not measured.

Furthermore, if a further bypass element is connected across $NEUTRAL_{IN}$ and $NEUTRAL_{OUT}$, the current sensor 112 and the further current sensor may measure substantially the same current (for example, 0 A). In this event, not only can the energy measurement unit 120 not accurately measure the amount of energy actually consumed, but it also potentially cannot identify that bypass element 310 has been connected.

The inventor has realised that if the impedance $R_{BYPASS}$ of the bypass element 310 can be determined, it may be possible to measure the bypass current $I_b$ by measuring the voltage between the phase line input terminal $IR_{IN}$ and the phase line output terminal $IR_{OUT}$.

The following explanation details how the bypass impedance between the phase line input terminal and the phase line output terminal, in parallel with the measurement path, is determined when a bypass element 310 is in place. In this case, the bypass impedance is the impedance of the bypass element 310 and the bypass current $I_b$ is the current following through the bypass element 310. However, as explained later, the same techniques may still be used to determine the bypass impedance between the phase line input terminal and the phase line output terminal, in parallel with the measurement path, when there is no bypass element 310 in place. In that case, the bypass impedance will be determined to be a very high impedance (tending to infinity) and the bypass current $I_b$ will correspondingly be found to be a very low value, tending to zero. Thus, regardless of whether or not a bypass element 310 is in place, the technique described below can be used to determine an accurate measure of the energy consumed by the consumer load 160.

Figure 4A:
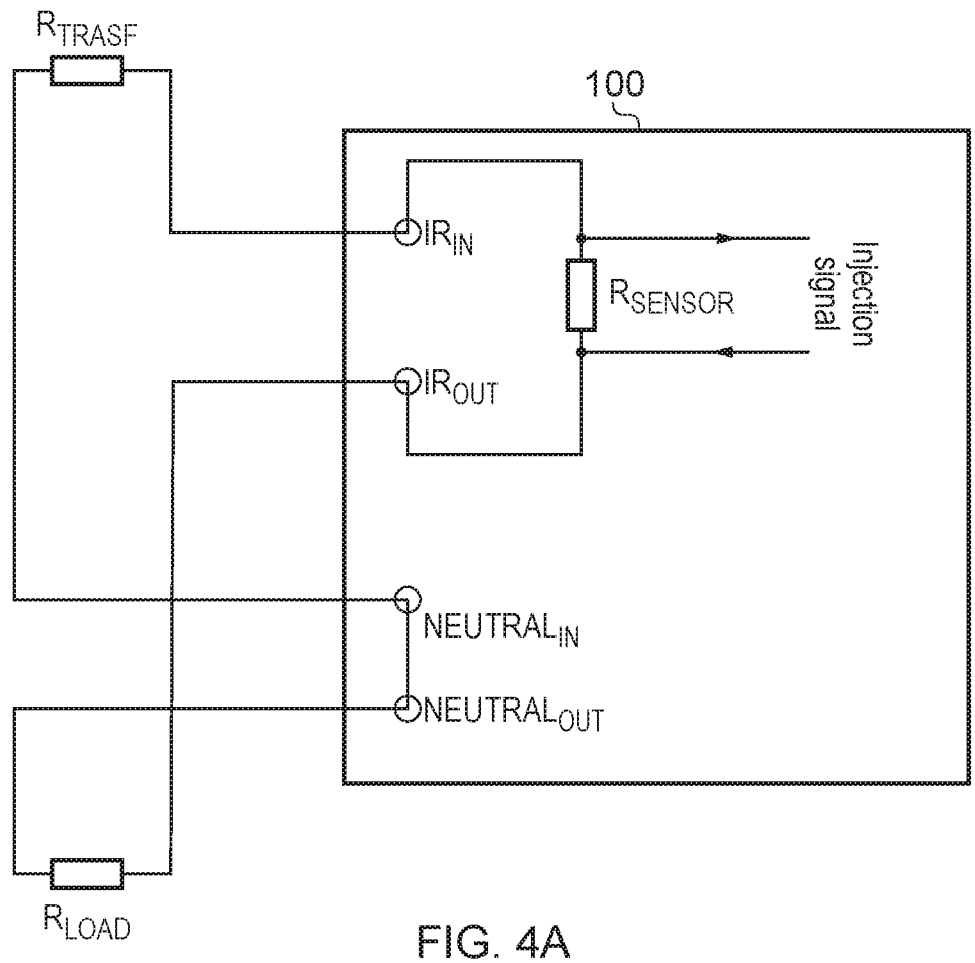
FIGS. 4A and 4B show simplified equivalent circuits representing impedances in and around the electric meter of FIG. 1 during normal operation.

FIG. 4A shows a simplified equivalent circuit representing the impedances in and around the electric meter 100 during normal, non-bypassed, operation (for example, during the operation represented in FIG. 1). The impedance $R_{TRANSF}$ is the impedance of a transformer substation that supplies the power to the electric meter 100. The size of $R_{TRANSF}$ is typically a couple of Ωs. $R_{LOAD}$ is the impedance of the consumer load 160. The size of $R_{LOAD}$ is typically a couple of Ωs. The impedance of the voltage sensor 130 is not represented in FIG. 4A and can be ignored because the impedance $R_1+R_2$ is relatively large (in the order of MΩs) compared with the impedance $R_{SENSOR}+R_{LOAD}$ in parallel with it.

Figure 4B:
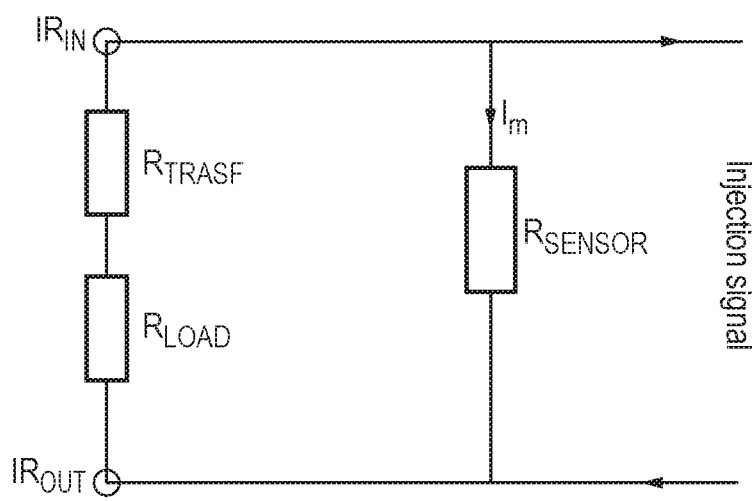

FIG. 4B shows a rearranged version of the circuit represented in FIG. 4A, to help explain the determination of $R_{APPARENT}$.

The apparent impedance $R_{APPARAENT}$ of the current sensor 112 is the measured impedance of the current sensor 112. It may be determined, for example, using the techniques that are described in WO2014/072733 and WO2013/038176 to which the reader is referred for enabling disclosures as to how to estimate the transfer function (for example, the impedance) of current sensors and which are incorporated in their entirety herein by reference. However, for ease of reference, an example from one of those patent applications is included herein.

For example, WO2013/038176 describes (with reference to FIGS. 1A and 1B of WO2013/038176) a technique of determining an estimate of the transfer function (for example, the impedance) of a shunt current sensor by injecting a reference input signal across the current sensor. In the example represented in FIGS. 1A and 1B of WO2013/038176, the current sensor is represented by reference numeral 110 and the injection signal is injected by a signal source represented by reference numeral 112. The signal source 112 may comprise a controllable current source/current sink which can controllably pass an additional current through the current sensor. The injection signal may be of a known frequency and phase and gives rise to a corresponding voltage change across the current sensor. The injection signal may have at least one component of frequency higher than the electrical supply signal frequency, for example a frequency greater than 5 kHz where the electrical supply signal has a dominant frequency of about 50 Hz. In this way, the injection signal should lie outside a band of the electrical supply signal and therefore be monitored independently of the electrical supply. By monitoring the changes in voltage across the current sensor that are caused by the injection signal (for example, using an ADC), it is possible to determine the apparent impedance $R_{APPARAENT}$ of the current sensor.

FIGS. 4A and 4B show the injection signal being applied across $R_{SENSOR}$. The injection signal may be generated by the energy measurement unit 120, or by some other unit/module in the electric meter 100. The corresponding voltage may be monitored, and $R_{APPARENT}$ determined, by the energy measurement unit 120 or by some other unit/module in the electric meter 100. It will be appreciated that whilst this is one particular technique for determining $R_{APPARAENT}$, it may be determined in any other suitable way.

With reference to FIG. 4B, it should be appreciated that $R_{APPARENT}$ is the impedance seen between the two injection terminals (i.e. between the terminal into which the signal is injected, represented by the inward pointing arrow in FIG. 4B, and the terminal from which the injected signal emerges, represented by the outward pointing arrow in FIG. 4B). As can be seen in FIG. 4B, $R_{SENSOR}$ is in parallel with $R_{TRANSF}$ and $R_{LOAD}$. As explained earlier, $R_{SENSOR}$ is typically very small, in the order of micro-ohms. In contrast, $R_{TRANSF}$ and $R_{LOAD}$ are relatively high, in the order of ohms. Since $R_{SENSOR} \ll R_{TRANSF}+R_{LOAD}$, the apparent impedance $R_{APPARENT}$ seen across the signal injection terminals should be substantially the same as the impedance of the current sensor $R_{SENSOR}$. Therefore, under normal electric meter 100 operating conditions, $R_{APPARENT}$ should accurately measure the impedance of the current sensor 112.

Figure 5A:
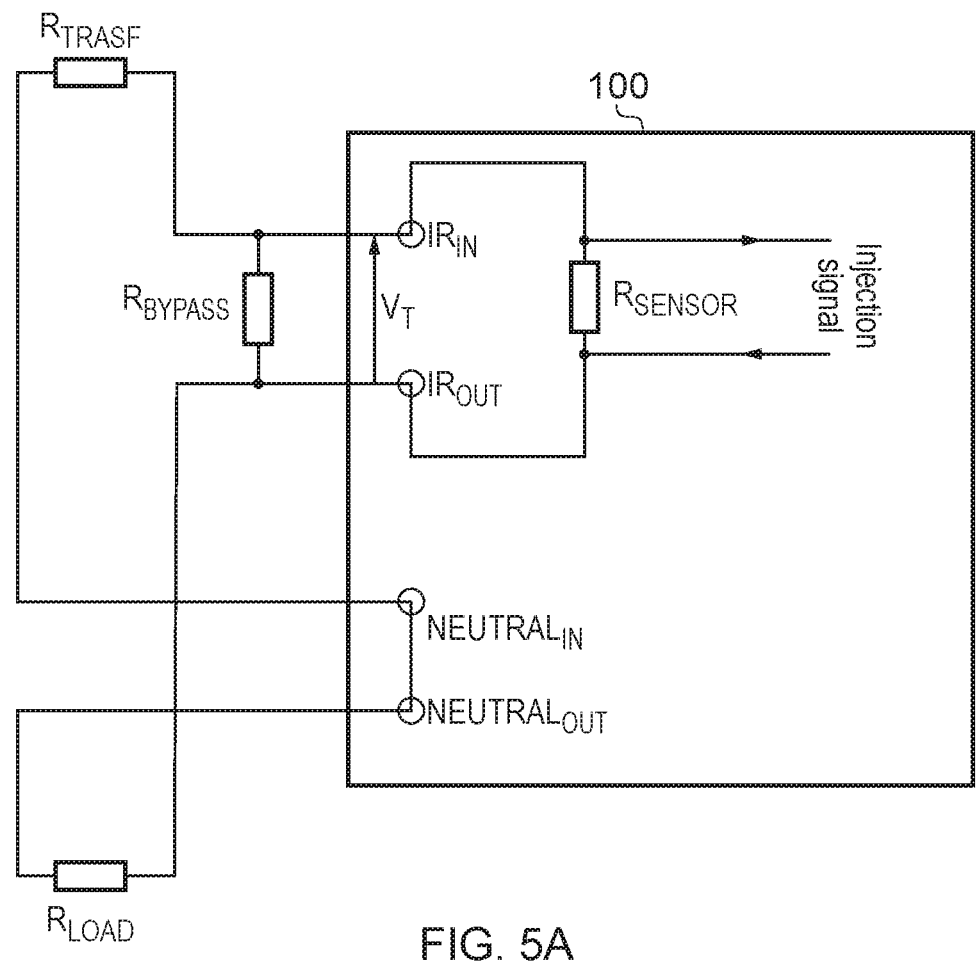
FIGS. 5A and 5B show simplified equivalent circuits representing impedances in and around the electric meter of FIG. 3 during the meter tampering event.

FIG. 5A shows a simplified equivalent circuit representing the impedances in and around the electric meter 100 when the bypass element 310 is connected (for example, during the bypass event represented in FIG. 3).

Figure 5B:
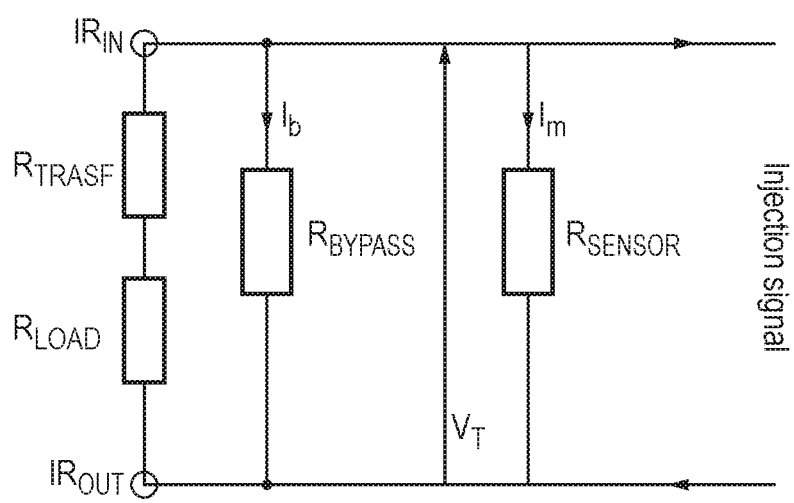

FIG. 5B shows a rearranged version of the circuit represented in FIG. 5A, to help explain how the value of $R_{APPARENT}$ is affected by the impedance of the bypass element $R_{BYPASS}$.

As explained earlier, since $R_{SENSOR} \ll R_{TRANSF}+R_{LOAD}$, the apparent impedance seen by the injection signal is not affected by $R_{TRANSF}+R_{LOAD}$. Therefore, $R_{TRANSF}$ and $R_{LOAD}$ may be ignored and the apparent impedance $R_{APPARENT}$ seen by the injection signal is $R_{SENSOR}$ in parallel with $R_{BYPASS}$. As also explained earlier, $R_{BYPASS}$ is typically very small (most usually a similar size to, or smaller than, $R_{SENSOR}$) to ensure that the bypass current $I_b$ is sufficiently large to make the electric meter tamper worthwhile. As a result, the apparent impedance $R_{APPARENT}$ seen by the injection signal will be lower than the impedance of the current sensor $R_{SENSOR}$.

The inventor has realised that the effect that a low value of bypass impedance $R_{BYPASS}$ has on the value of $R_{APPARENT}$ can be utilised to determine the value of $R_{BYPASS}$, which can in turn be used to determine $I_b$. In particular, the meter current $I_m$ can be measured by the energy measurement unit 120 using the current sensor 112, for example in accordance with the formula:

$$I_m = \frac{V_{SENSOR}}{R_{SENSOR}}$$

where $V_{SENSOR}$ is the voltage across the current sensor 112 and can be measured by the energy measurement unit 120, for example using a suitable ADC. $R_{SENOR}$ is the known impedance of the current sensor 112, which the energy measurement unit 120 may store in memory (or access from a separate memory unit in the electric meter 100 or elsewhere). The stored value of $R_{SENSOR}$ may be set at the time the electric meter 100 is manufactured and calibrated, or it may be set by virtue of an injection signal test at a time before the bypass event occurred. In the latter case, the energy measurement unit 120 may identify a bypass event by virtue of a significant change in the value of $R_{APPARENT}$ and/or by virtue of a difference in the size of current measured by the current sensor 112 and the size of current measured by a further current sensor coupled across the neutral terminals NEUTRAL$_{IN}$ and NEUTRAL$_{OUT}$. The energy measurement unit 120 may thus recognise that R$_{APPARENT}$ is no longer an accurate measure of the impedance of the current sensor 112 and that the most recently stored, reliable value of impedance of the current sensor 112 should instead be used for R$_{SENSOR}$.

During the bypass event:

$$R_{APPARENT} = \frac{R_{SENSOR} \times R_{BYPASS}}{R_{SENSOR} + R_{BYPASS}}$$

Therefore, R$_{BYPASS}$ can be determined based on the known impedance of the current sensor, R$_{SENSOR}$, and a measurement of the apparent impedance of the current sensor, R$_{APPRAENT}$, as follows:

$$R_{BYPASS} = \frac{R_{SENSOR} \times R_{APPARENT}}{R_{SENSOR} - R_{APPARENT}}$$

R$_{APPARENT}$ may be measured in any suitable way, for example using the injection signal technique described above.

The bypass current I$_b$ may then be determined based on R$_{BYPASS}$ and a measured voltage V$_T$ between the phase line input terminal IR$_{IN}$ and the phase line output terminal IR$_{OUT}$ as follows:

$$I_b = \frac{V_T}{R_{BYPASS}}$$

For electric meter 100, V$_T$ is the same as V$_{SENSOR}$ described above. Consequently, it is not necessary to make a further voltage measurement in this example aspect of the disclosure.

The total amount of current actually consumed by the consumer load 160 is:

$$I = I_b + I_m$$

Thus, it is possible to determine the actual amount of energy consumed by the consumer load 160 during a bypass event, thereby rendering the bypass ineffectual and meaning that energy consumption can be correctly measured and billed even during a bypass event. Furthermore, the above process also works even when a further bypass element is connected across the neutral terminals NEUTRAL$_{IN}$ and NEUTRAL$_{OUT}$.

Figure 6:
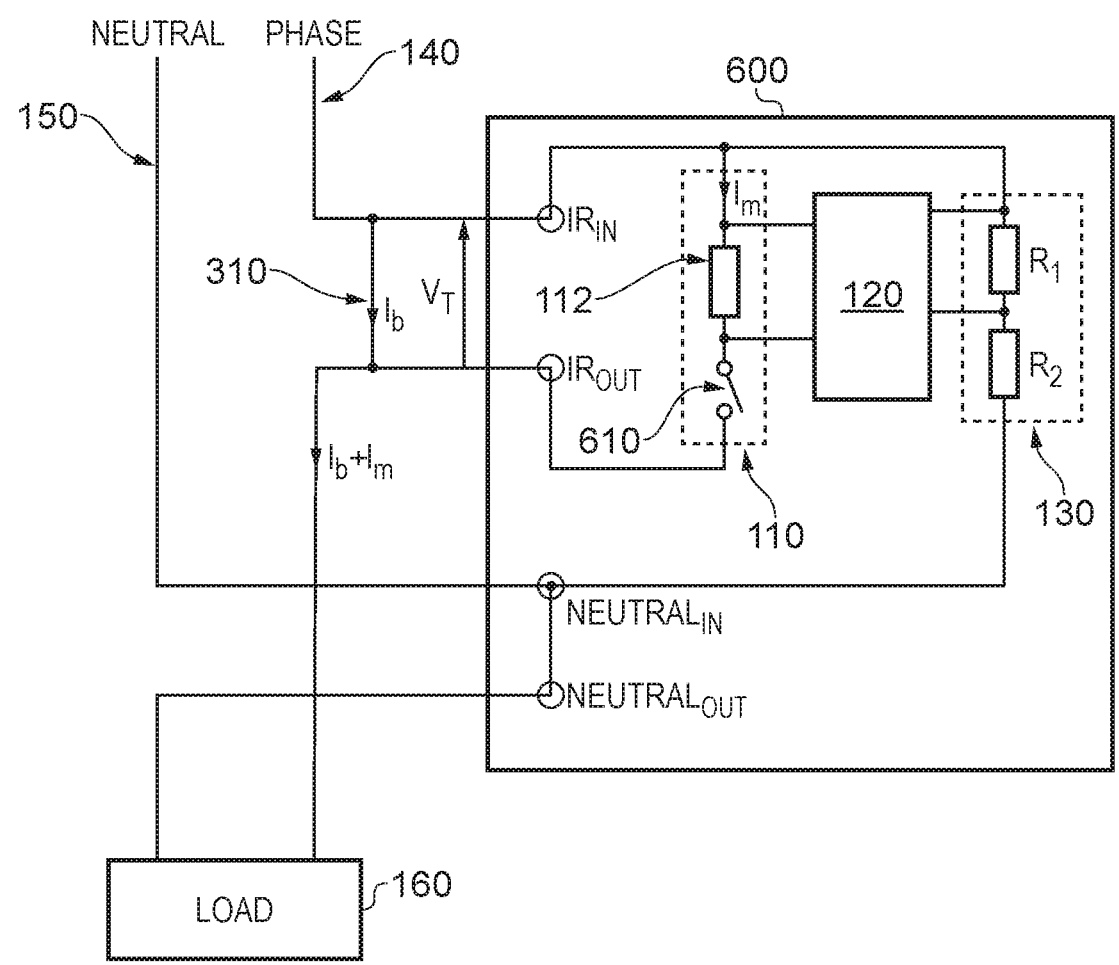
FIG. 6 shows a schematic representation of an example electric meter in accordance with a further aspect of this disclosure.

FIG. 6 shows a schematic representation of an example single phase electric meter 600 in accordance with a further aspect of the present disclosure. The electric meter 600 is very similar to electric meter 100, except for the inclusion of a switch 610, such as a relay or transistor switch, in the measurement path 120 in series with the current sensor 112. The switch 610 is controllable, for example by the energy measurement unit 120 or any other suitable module/unit, such that the switch 610 can be normally held closed, but can be opened in order to cut the electric supply to the consumer load 160, for example in the event that electric bills are not being paid. It will be appreciated that multi-phase electric meters, such as the three-phase electric meter 200 represented in FIG. 2, may also include switches in their measurement paths in series with their current sensors.

Figure 7A:
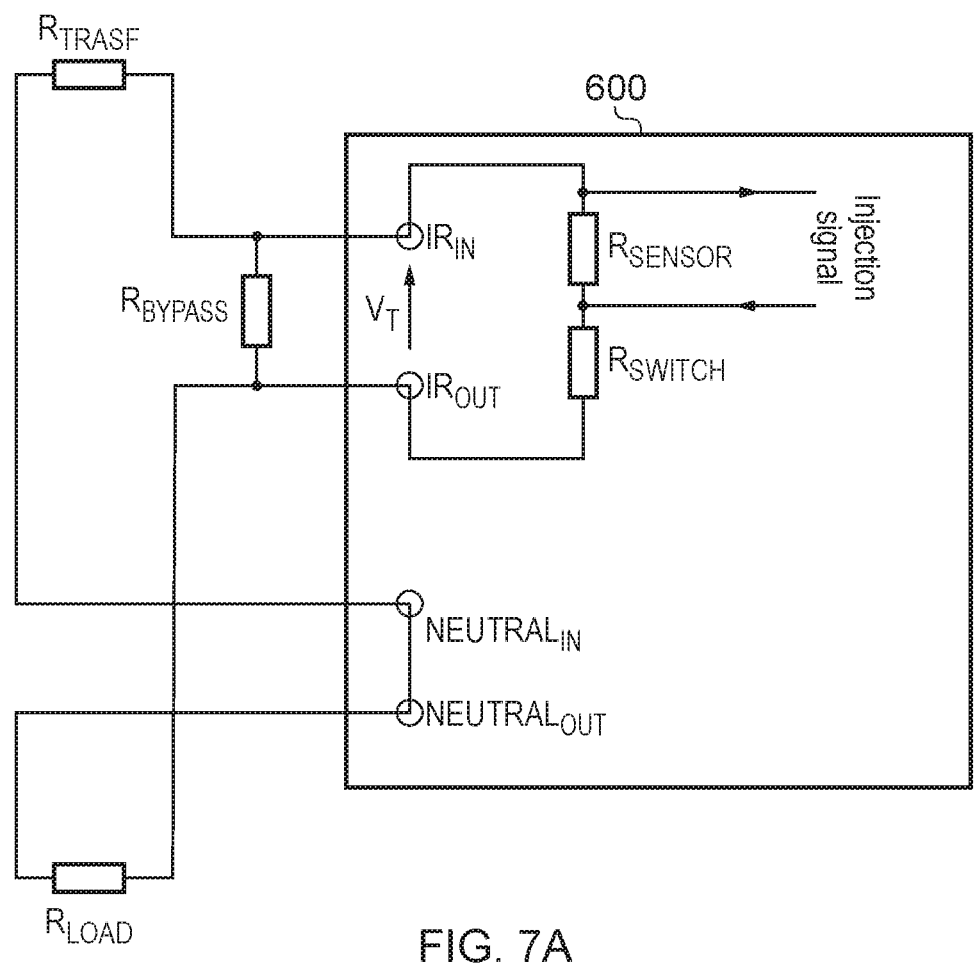
FIGS. 7A and 7B show simplified equivalent circuits representing impedances in and around the electric meter of FIG. 6 during a meter tampering event.

FIG. 7A shows a simplified equivalent circuit representing the impedances in and around the electric meter 600 when the bypass element 310 is connected.

Figure 7B:
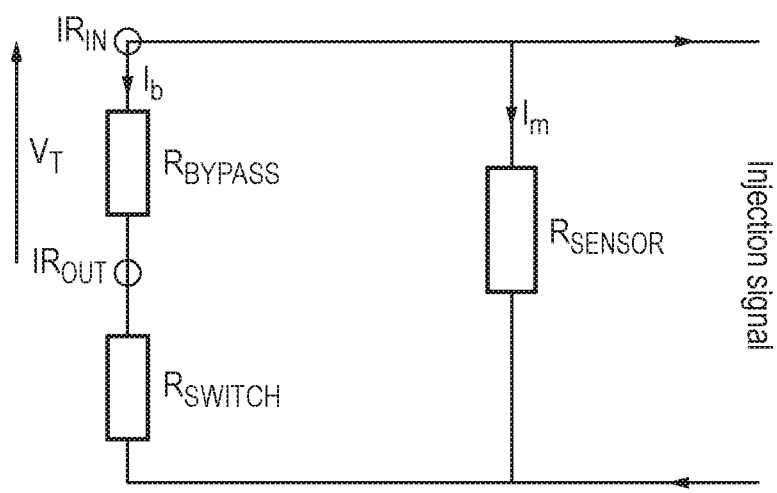

FIG. 7B shows a rearranged version of the circuit represented in FIG. 7A, to help visualise the impedance presented to the injection signal and, therefore, the apparent impedance R$_{APPARENT}$ that is determined by the injection signal. The impedances R$_{TRANSF}$ and R$_{LOAD}$ are in parallel with the impedance R$_{BYPASS}$, but are not represented as they can be ignored due to their relative size, as explained earlier in respect of FIG. 4B. The on-state impedance of the switch 610 is R$_{SWITCH}$ and will typically be relatively low, for example in the order of 10s or 100s of micro-ohms, such as 80 µΩ, or 300 µΩ, or 500 µΩ, etc.

With the presence of the switch 610, the apparent impedance R$_{APPARENT}$ seen by the injection signal is:

$$R_{APPARENT} = \frac{R_{SENSOR} \times (R_{BYPASS} + R_{SWITCH})}{R_{SENSOR} + R_{BYPASS} + R_{SWITCH}}$$

Therefore, R$_{BYPASS}$ is:

$$R_{BYPASS} = \frac{R_{SENSOR} \times R_{SWITCH} - R_{APPARENT} \times (R_{SENSOR} + R_{SWITCH})}{R_{APPARENT} - R_{SENSOR}}$$

Thus, in order to determine R$_{BYPASS}$, not only is it necessary to measure R$_{APPARENT}$, it is also necessary to know R$_{SWITCH}$. In some implementations, it may be sufficient to use a stored value for R$_{SWITCH}$, for example one stored in memory in the energy measurement unit 120 (or accessed by the energy measurement unit 120 from a separate memory unit in the electric meter 600 or elsewhere) at the time the electric meter 600 is manufactured and calibrated. However, for some types of switch, for example relay switches, the impedance may vary substantially from switch to switch, and may change significantly over time, for example as a result of electrical contact erosion, etc. Therefore, the impedance R$_{SWITCH}$ of the switch 610 may need to be measured by the energy measurement unit 120 in order to determine accurately R$_{BYPASS}$ and therefore accurately measure the amount of actual energy consumed by the consumer load 160.

The voltage V$_T$ across the phase line input terminal IR$_{IN}$ and the phase line output terminal IR$_{OUT}$ is also the voltage across the current sensor 112 and switch 610. Therefore:

$$V_T = I_m R_{SENSOR} + I_m R_{SWITCH}$$

Thus, the impedance R$_{SWITCH}$ may be expressed as:

$$R_{SWITCH} = \frac{V_T}{I_m} - R_{SENSOR}$$

Therefore, the impedance R$_{SWITCH}$ may be determined based on the voltage V$_T$ between the phase line input terminal IR$_{IN}$ and phase line output terminal IR$_{OUT}$, the meter current I$_m$ and the impedance R$_{SENSOR}$. As a result of the presence of the switch 610, the voltage V$_T$ is on longer the same as the voltage across the current sensor 112, so the voltage V$_T$ needs to be measured separately. Thus, by measuring the voltage V$_T$, it is possible to determine the impedance R$_{SWITCH}$ and, therefore, the impedance R$_{BYPASS}$ and the bypass current I$_b$. Consequently, the actual amount of energy consumed can be measured even when the bypass element 310 is connected (and even when a further bypass element is connected across the neutral terminals NEUTRAL$_{IN}$ and NEUTRAL$_{OUT}$), such that the consumer will continue to be billed correctly for the energy that they consume.

The voltage $V_T$ may be measured in any suitable way. Where the voltage $V_T$ is measured using an ADC, there may be a complication caused by the switch 610. When the switch 610 is closed, the combined impedance of the current sensor 112 and the switch 610 is very low, which means that $V_T$ is likely to be very low, for example in the order of milli-volts. Therefore, a relatively sensitive ADC would be required to measure $V_T$ accurately. However, if the switch 610 is opened, $V_T$ would be equal to the neutral to phase line voltage, which means that $V_T$ is likely to be very high, for example between about 115 and 250 volts RMS in a domestic environment. Such a high voltage would be likely to damage a high sensitivity ADC. With this in mind, a voltage divider may be utilised in the measurement process.

Figure 8:
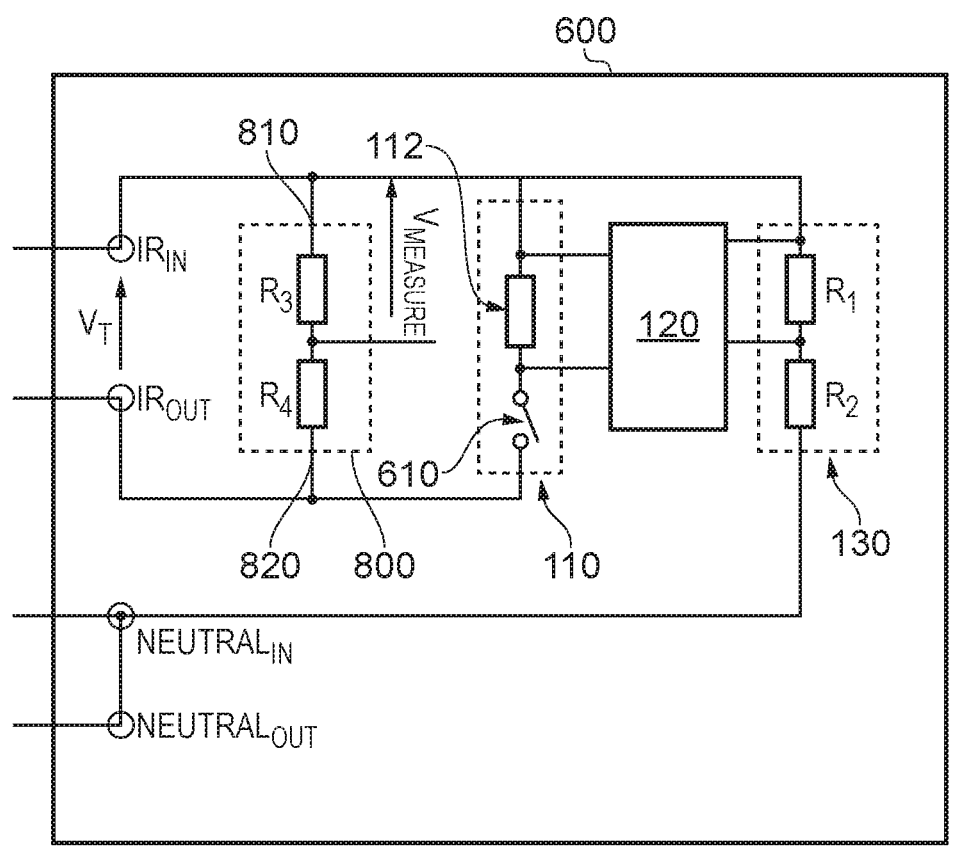
FIG. 8 shows an example schematic representation of a voltage divider coupled to a measurement path of the electric meter of FIG. 6.

FIG. 8 shows an example schematic representation of a voltage divider 800 coupled to the measurement path 120. The voltage divider is configured to produce a voltage measurement signal $V_{MEASURE}$ that is dependent on, but smaller than, the voltage $V_T$. The voltage divider comprises a first input 810 and a second input 820. In this particular example, the first input 810 is coupled to the phase line input terminal IR$_{IN}$ and the second input 820 is coupled to the phase line output terminal IR$_{OUT}$, such that it is coupled across the phase line input terminal IR$_{IN}$ and the phase line output terminal IR$_{OUT}$.

The voltage divider 800 comprises a potential divider $R_3$ and $R_4$ coupled between the first input 810 and the second input 820. The voltage measurement signal $V_{MEASURE}$ is the voltage across resistor $R_3$. The resistor $R_3$ is relatively small, for example in the order of 10s or 100s of Ω, or in the order of kΩs, such as 300 Ω, or 1 kΩ, or 2 kΩ, etc. The resistor $R_4$ is relatively large, for example in the order of 10s or 100s of kΩ, or in the order of MΩs, such as 200 kΩ, or 1MΩ, or 5MΩ, etc. Thus, $V_{MEASURE}$ will be a relatively small fraction of $V_T$. As a result, a very sensitive ADC should still be able to measure $V_T$ accurately when the switch 610 is closed, but should also not be damaged if the switch 610 is opened, since $R_3$ and $R_4$ can be set to values that ensure that the range of $V_{MEASURE}$ will always stay within safe limits. The energy measurement unit 120 may therefore determine $V_T$ by measuring $V_{MEASURE}$ and then scaling the measured voltage up according to the ratio of $R_3$:$R_4$. Furthermore, because $R_3$+$R_4$ is very large compared with $R_{SENSOR}$, $R_3$ and $R_4$ will not affect the measurement of the apparent impedance $R_{APPARENT}$ of the current sensor 112.

Figure 9:
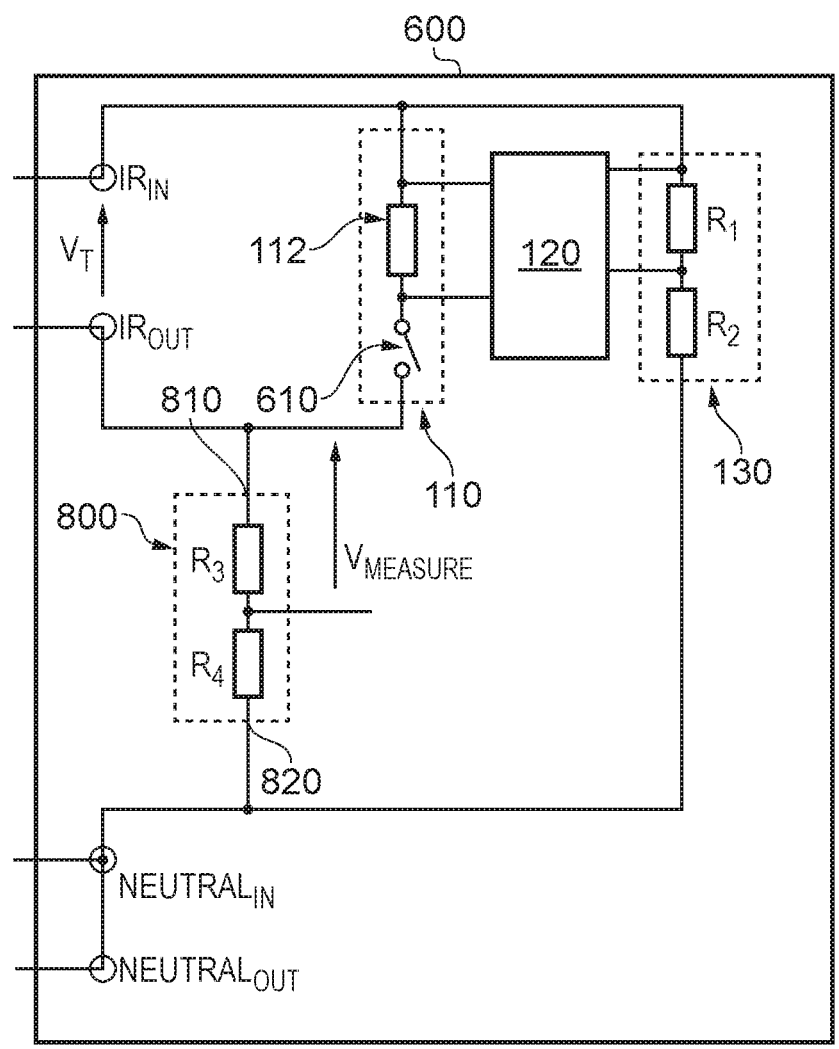
FIG. 9 shows a further example schematic representation of a voltage divider coupled to a measurement path of the electric meter of FIG. 6.

FIG. 9 shows a further example schematic representation of the voltage divider 800 coupled to the measurement path 120. In this example, the first input 810 is coupled to the phase line output terminal IR$_{OUT}$ and the second input 820 is coupled to the neutral terminal NEUTRAL$_{IN}$ (but may alternatively be coupled to the NEUTRAL$_{OUT}$), such that it is coupled between IR$_{OUT}$ and NEUTRAL$_{IN}$. Therefore, the voltage measurement signal $V_{MEASURE}$ in this example is indicative of a potential of the phase line output terminal IR$_{OUT}$ relative to neutral.

The energy measurement unit 120 can measure the potential of the phase line input terminal IR$_{IN}$ relative to neutral based on the measured voltage across $R_1$. Consequently, the voltage $V_T$ can be determined based on the potential of the phase line input terminal IR$_{IN}$ relative to neutral and the potential of the phase line output terminal IR$_{OUT}$ relative to neutral, for example by finding the difference. As a result, again, very sensitive ADCs should still be able to measure $V_T$ accurately when the switch 610 is closed, but should also not be damaged if the switch 610 is opened, since $R_3$ and $R_4$ can be set to values that ensure that the range of $V_{MEASURE}$ will always stay within safe limits.

The skilled person will readily appreciate that various alterations or modifications may be made to the above described aspects of the disclosure without departing from the scope of the disclosure.

For example, the energy measurement unit 120 may be implemented in any suitable way by software, hardware or a combination of software and hardware. For example, its functionality may be implemented by a microcontroller, or by a dedicated piece of hardware, or by software comprising computer readable code, which when executed on the processor of any electronic device, performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives.

Whilst in the above, the current sensor 112 is implemented as a current shunt, it may alternatively be any type of current sensor, for example a CT or Rogowski coil. The apparent impedance $R_{APPARENT}$ may be determined in any suitable way. For example, where the current sensor 112 is a CT, $R_{APPARENT}$ may be determined by applying an injection signal across the wire carrying the meter current $I_m$, which passes through the centre of the CT, thereby applying the injection signal across the current sensor as described above and enabling a measurement of the apparent impedance of the CT. Whilst the voltage sensor 130 is implemented by a potential divider in the above description, it may alternatively be implemented in any other suitable way, for example by a voltage transformer. Likewise, whilst the voltage divider 800 described above is implemented by a potential divider, the voltage $V_T$ may alternatively be measured in any other suitable way.

Furthermore, whilst in the above it is explained that the energy measurement unit 120 may detect a bypass tamper event by comparing the current measured by the current sensor 112 and a further current sensor coupled between NEUTRAL$_{IN}$ and NEUTRAL$_{OUT}$, it will be appreciated that the energy measurement unit 120 may detect a bypass tamper event in any other suitable way. For example, it may monitor the apparent impedance of the current sensor 112 and identify a bypass tamper event by virtue of a change in the apparent impedance over time (for example, by detecting a difference between the apparent impedance $R_{APPARENT}$ and the known impedance of the current sensor $R_{SENSOR}$ that exceeds a predetermined threshold amount). In a further example, the energy measurement unit 120 may identify a bypass tamper event by virtue of an unusual change in the size of the meter current $I_m$ (for example, where there is a significant reduction in $I_m$ compared with normal usage). In a further example, the energy measurement unit 120 may identify a bypass tamper event by receiving an tamper alert from another entity/module, such as by receiving a tamper alert communication from the utility provider that notifies the energy measurement unit 120 that a tamper event may be taking place.

In some implementations, the energy measurement unit 120 may be configured to measure the energy consumed using the current sensor 112 in the traditional way and, after identifying a bypass tamper event, measure the actual energy consumed using the techniques described above. In other implementations, the energy measurement unit 120 may be configured always to measure the energy consumed using the techniques described above. When no bypass tamper event is taking place, $R_{APPARENT}$ will substantially equal $R_{SENSOR}$ meaning that bypass impedance $R_{BYPASS}$ will be determined to have a very high impedance (divide by 0). This makes sense, as the bypass impedance $R_{BYPASS}$ is the impedance between the phase line input terminal $IR_{IN}$ and the phase line output terminal $IR_{OUT}$ in parallel with the measurement path. When there is no bypass element 310 in place, that impedance will be very large. A very high bypass impedance will mean a very small bypass current $I_b$ is determined, tending to 0. Again, this makes sense as when there is no bypass element 310 in place, there will effectively be no bypass current flowing between the phase line input terminal $IR_{IN}$ and the phase line output terminal $IR_{OUT}$, in parallel with the measurement path 110. Therefore, when no bypass event is taking place, $I_b$ would be measured as a very small value, tending to 0, such that the total consumed current would still be accurately measured as the meter current $I_m$.

The invention claimed is:

1. An energy measurement unit for use with an electric meter to measure energy consumed by a consumer load, wherein the electric meter comprises a measurement path coupled between a phase line input terminal and a phase line output terminal of the electronic meter, and wherein the measurement path comprises a current sensor for use in measuring electrical energy consumption, the energy measurement unit being configured to:
measure, using the current sensor, a meter current flowing through the measurement path;
measure a voltage between the phase line input terminal and the phase line output terminal;
determine a bypass impedance between the phase line input terminal and the phase line output terminal, in parallel with the measurement path;
determine a bypass current flowing between the phase line input terminal and the phase line output terminal, in parallel with the measurement path, based at least in part on the determined bypass impedance and the voltage between the phase line input terminal and the phase line output terminal; and
determine the energy consumed by the consumer load based at least in part on the meter current and the bypass current.

2. The energy measurement unit of claim 1, further configured to:
measure an apparent impedance of the current sensor; and
determine the bypass impedance based at least in part on the apparent impedance of the current sensor and a known impedance of the current sensor.

3. The energy measurement unit of claim 1, wherein the measurement path further comprises a switch in series with the current sensor, the energy measurement unit being further configured to:
determine an impedance of the switch; wherein determining the bypass impedance is further based at least in part on the impedance of the switch.

4. The energy measurement unit of claim 3, wherein determining the impedance of the switch is further based on the meter current, the known impedance of the current sensor, and the voltage between the phase line input terminal and the phase line output terminal.

5. The energy measurement unit of claim 1, wherein the electric meter further comprises a voltage divider coupled to the measurement path and configured to produce a voltage measurement signal that is dependent on, but is smaller than, the voltage between the phase line input terminal and the phase line output terminal, and wherein the energy measurement unit is further configured to:
determine the voltage between the phase line input terminal and the phase line output terminal based at least in part on the voltage measurement signal.

6. The energy measurement unit of claim 5, wherein the voltage divider comprises:
a first input coupled to the phase line input terminal; and
a second input coupled to the phase line output terminal, such that the voltage divider is coupled across the phase line input terminal and the phase line output terminal, in parallel with the measurement path.

7. The energy measurement unit of claim 5, wherein the voltage divider comprises:
a first input coupled to the phase line output terminal; and
a second input is coupled to a neutral terminal of the electric meter, such that the voltage measurement signal is indicative of a potential of the phase line output terminal relative to neutral,
wherein the energy measurement unit is configured to determine the voltage between the phase line input terminal and the phase line output terminal by:
determining the potential of the phase line output terminal relative to neutral based on the voltage measurement signal;
determining a potential of the phase line input terminal relative to neutral; and
determining the voltage between the phase line input terminal and the phase line output terminal based on the potential of the phase line input terminal relative to neutral and the potential of the phase line output terminal relative to neutral.

8. The energy measurement unit of claim 6, wherein the voltage divider comprises:
a potential divider coupled between the first input and the second input, wherein the potential divider comprises two impedance elements, one of which has a larger impedance than the other, and
wherein the voltage measurement signal is indicative of a voltage across the smaller impedance element of the potential divider.

9. The energy measurement unit of claim 1, further configured to measure the apparent impedance of the current sensor by:
applying an injection signal of known current and frequency across the current sensor; and
measuring a resulting voltage substantially at the known frequency.

10. A method of determining using an electric meter, wherein the electric meter comprises a measurement path coupled between a phase line input terminal and a corresponding phase line output terminal of the electric meter, and wherein the measurement path comprises a current sensor for use in measuring electrical energy consumption, the method comprising:
measuring, using the current sensor, a meter current flowing through the measurement path;
measuring a voltage between the phase line input terminal and the phase line output terminal;
determining a bypass impedance between the phase line input terminal and the phase line output terminal, in parallel with the measurement path;
determining a bypass current flowing between the phase line input terminal and the phase line output terminal, in parallel with the measurement path, based at least in part on the determined bypass impedance and the voltage between the phase line input terminal and the phase line output terminal; and determining the actual energy consumed based at least in part on the meter current and the bypass current.

11. The method of claim 10, further comprising:

measuring an apparent impedance of the current sensor; and determining the bypass impedance based at least in part on the apparent impedance of the current sensor and a known impedance of the current sensor.

12. The method of claim 10, wherein the measurement path further comprises a switch in series with the current sensor, the method further comprising:

determining an impedance of the switch; wherein determining the bypass impedance is further based at least in part on the impedance of the switch.

13. The method of claim 12, wherein determining the impedance of the switch is further based on the meter current, the known impedance of the current sensor, and the voltage between the phase line input terminal and the phase line output terminal.

14. The method of claim 10, wherein the electric meter further comprises a voltage divider coupled to the measurement path and configured to produce a voltage measurement signal that is dependent on, but is smaller than, the voltage between the phase line input terminal and the phase line output terminal, and wherein the method further comprises:

determining the voltage between the phase line input terminal and the phase line output terminal based at least in part on the voltage measurement signal.

15. The method of claim 10, wherein measuring the apparent impedance of the current sensor comprises:

applying an injection signal of known current and frequency across the current sensor; and measuring a resulting voltage substantially at the known frequency.

16. A method of determining an impedance of a bypass element coupled to an electric meter, wherein the electric meter comprises a measurement path coupled between a phase line input terminal and a corresponding phase line output terminal of the electric meter, the bypass element coupled in parallel with a measurement path of the electric meter, so as to at least partially bypass a current sensor in the measurement path, the method comprising:

measuring an apparent impedance of the current sensor in the measurement path of the electric meter; and determining an impedance of the bypass element in parallel with the measurement path of the electric meter so as to at least partially bypass the current sensor in the measurement path of the electric meter, based at least in part on the measured apparent impedance of the current sensor and a stored reference impedance of the current sensor.

17. The method of claim 16, wherein the measurement path further comprises a switch in series with the current sensor, the method further comprising:

determining an impedance of the switch; wherein determining the impedance of the bypass element is further based at least in part on the impedance of the switch.

18. The method of claim 17, further comprising:

measuring a voltage between the phase line input terminal and the phase line output terminal, wherein determining the impedance of the switch is further based on the meter current, the stored reference impedance of the current sensor, and the voltage between the phase line input terminal and the phase line output terminal.

19. The method of claim 16, further comprising:

measuring a voltage between the phase line input terminal and the phase line output terminal; and determining a bypass current flowing through the bypass element based on the determined impedance of the bypass element and the voltage between the phase line input terminal and the phase line output terminal.

20. The method of claim 16, further comprising:

measuring, using the current sensor, a meter current flowing through the measurement path; and determining the actual energy consumed based at least in part on the meter current and the bypass current.

* * * * *